(12) United States Patent
Holzer

(10) Patent No.: US 7,821,271 B2
(45) Date of Patent: Oct. 26, 2010

(54) METHOD FOR TESTING A COMMUNICATION CONNECTION

(75) Inventor: Werner Holzer, Buxtehude (DE)

(73) Assignee: Airbus Deutschland GmbH, Hamburg (DE)

( * ) Notice: Subject to any disclaimer, the term of this patent is extended or adjusted under 35 U.S.C. 154(b) by 357 days.

(21) Appl. No.: 12/081,879

(22) Filed: Apr. 23, 2008

(65) Prior Publication Data
US 2010/0037107 A1 Feb. 11, 2010

Related U.S. Application Data

(60) Provisional application No. 60/914,351, filed on Apr. 27, 2007.

(30) Foreign Application Priority Data

Apr. 27, 2007 (DE) .................. 10 2007 020 480

(51) Int. Cl.
*G01R 31/02* (2006.01)
*G01R 19/00* (2006.01)
(52) U.S. Cl. .................... 324/539; 324/76.11
(58) Field of Classification Search ............ 324/539, 324/537, 500, 555, 76.11
See application file for complete search history.

(56) References Cited

U.S. PATENT DOCUMENTS

| 5,552,699 | A | | 9/1996 | Redmer | |
|---|---|---|---|---|---|
| 5,751,746 | A | * | 5/1998 | Strauss | 714/819 |
| 6,324,658 | B1 | * | 11/2001 | Jasperneite et al. | 714/43 |
| 6,411,866 | B1 | * | 6/2002 | Cavanagh | 701/1 |
| 2005/0110567 | A1 | * | 5/2005 | Rabinovich et al. | 330/149 |
| 2005/0287954 | A1 | * | 12/2005 | Lim et al. | 455/67.11 |

FOREIGN PATENT DOCUMENTS

| DE | 44 21 083 | 12/1995 |
|---|---|---|
| DE | 197 52 792 | 6/1999 |
| DE | 10 2005 011 897 | 1/2006 |

\* cited by examiner

*Primary Examiner*—Hoai-An D Nguyen
(74) *Attorney, Agent, or Firm*—Nixon & Vanderhye P.C.

(57) ABSTRACT

The invention relates to a method for testing a communication connection in a communication network in an aircraft with at least a first controller, a second controller and a third controller. The method includes the steps: generation of a first predefined signal, output of the first signal at a predefined output of the first controller and sending of the first signal to the third controller by the first controller; detection of a first incoming signal at a predefined input of the second controller which is connected via the communication connection to the predefined output of the first controller, and sending of the incoming signal to the third controller by the second controller; comparison of the first predefined signal with the first incoming signal by the third controller and generation of a first identicalness signal if the first predefined signal and the first incoming signal are the same; repetition of the steps with a second predefined signal and generation of a second identicalness signal by the third controller if the second predefined signal and a second incoming signal are the same; output of an enabling signal if the first and the second identicalness signal have been generated.

5 Claims, 3 Drawing Sheets

METHOD FOR TESTING A COMMUNICATION CONNECTION

This application claims priority German Application No 10 2007 480.0 filed Apr. 27, 2007 and U.S. Provisional Application No. 60/914,351 filed Apr. 27, 2007, the entire contents of each of which are hereby incorporated by reference.

The invention relates to a test method for testing an electrical installation on-board an aircraft. In particular the invention relates to a method for testing a communication connection in a communication network in an aircraft according to the introductory clause of claim 1.

In today's aircraft, numerous systems are implemented that are used for flight management, flight control (guidance), fuel monitoring, cabin settings, navigation, airspace monitoring, ground to air communication, etc. The "central point" of each system is the system controller which contains the system control and controls the participating elements. On the ground and during the flight each on-board system requires data from other systems in order to output the corresponding commands and thus to control the aircraft. The complex communication of the systems with each other has led to the development of networks such as the AFDX network in the newest generation of aircraft. The communication is realised via bus systems such as ARINC 429, CAN, AFDX with the corresponding communication protocols. Likewise, discrete lines are used which can have different states such as connected to earth or interrupted. The system controller monitors during the whole time the communication with other external systems. If data that are expected are not received because a communication connection fails, a corresponding error message is output. This is noted (by the pilot in the log book) and the reason for the fault is investigated after landing.

For this, at the present time the following method is implemented: the two controllers in question are removed; the defective connections are identified; a circuit continuity tester is connected to the corresponding connections of the controllers A and B, which requires very long cable connections under certain conditions; a circuit continuity test is carried out; the two controllers are installed again; a functional test of the two controllers is carried out after the installation.

The methods according to the prior art have the disadvantage that the time threshold of 10 to 15 minutes is easily exceeded; the cabling, the removal of the controllers, the installation of the circuit continuity tester, the re-incorporation of the controllers and the functional test take too long and a start delay cannot therefore be ruled out.

With the methods mentioned which are based on the testing of electrical networks with a multimeter the connection between a first connector A and a second connector B, which are connected to each other by a data bus and a discrete line, is tested. A multimeter is connected on the one hand to the bus on the connector A and on the other hand it is connected to the bus on the connector B. If the bus is intact, i.e. has no line interruption, there is the same electrical potential on both sides of the bus, thus on the connector A and on the connector B. The potential difference (voltage) between the two connection points of the multimeter is zero. If on the other hand the bus is interrupted, the two connection points of the bus no longer have the same potential. The potential difference differs from zero. This is measured with the multimeter and indicated to the user.

The above measurement principle for the testing of an electrical line can be generalised: instead of the electrical potential any electrical measurement value can be selected and be supplied at one end of the respective line. It is then tested whether this electrical value is correspondingly set at the second end of the line or not.

A further method for testing the cabling of electrical consumers is known from U.S. Pat. No. 5,552,699. In order to test the cables in buildings it is proposed therein to supply to all inputs or outputs of a switch cabinet signals with the digital addresses of the respective input or output. These addresses relate to the respective installations such as sensors or servomotors. In order to test the cabling the addresses of the inputs and outputs of the switch cabinet are read on the installations and then associated with the respective field units in a current address list. A comparison between the reference list and the current address list then reveals whether and where cabling faults are present.

This method requires, however, that the signals at the inputs and outputs of the switch cabinet must be read directly on the respective installations. Access to the installations is, however, not always possible.

It is an object of the invention to indicate a method that allows a quick and low-resource testing of communications connections in an aircraft.

This object is achieved with the method according to claim 1. Preferred embodiments of the invention are the subject matter of the dependent claims.

The invention is based upon an electrical signal with certain features being supplied to one end of the line and testing whether the same features are found at the second end of the line. This test is carried out by an independent controller which has no electrical connection to the line to be measured. The independent controller communicates instead with a first controller A and with a second controller B which are connected to the line to be tested. The independent controller sends to the first and the second controller commands, with which, amongst other things a certain electrical signal with certain features is supplied to an output "x" of the first controller. The output "x" is thereby electrically connected to the line to be tested. With a second command the second controller B is asked to detect signals at an input "y". The input "y" is electrically connected to the line to be tested. It is then tested whether the features of the signals at the input "y" of the second controller are the same features as with the signal at the output "x" of the first controller.

The method according to the invention for testing a communication connection in a communication network in an aircraft with at least a first controller, a second controller and a third controller comprises the steps: generation of a first predefined signal, output of the first signal at a predefined output of the first controller and sending of the first signal to the third controller by the first controller; detection of a first incoming signal at a predefined input of the second controller which is connected via the communication connection to the predefined output of the first controller, and sending of the incoming signal to the third controller by the second controller; comparison of the first predefined signal with the first incoming signal by the third controller and generation of a first identicalness signal if the first predefined signal and the first incoming signal are the same; repetition of the steps with a second predefined signal and generation of a second identicalness signal by the third controller if the second predefined signal and a second incoming signal are the same; output of an enabling signal if the first and the second identicalness signal have been generated.

In a particularly preferred embodiment of the invention a further feature of the method is that the first predefined signal at the predefined output is a modulated electrical signal. Thus, not only galvanic connections can be tested but instead it is also possible to test the frequency dependence of the connections.

In a further particularly preferred embodiment of the invention a further feature of the method is that it is checked whether essentially the same modulated electrical signal can be found at the predefined input of the second controller. It is hereby considered that the features of the sent signal do not have to be completely identical to those of the received signal (e.g. on account of line parameters). Instead, a certain error tolerance or distortion of the signal is allowed.

In a further particularly preferred embodiment of the invention a further feature of the method is that the first predefined signal at the predefined output of the first controller is generated in that the output is connected to earth. This is a particularly simple and low-resource test.

In an alternative particularly preferred embodiment of the invention a further feature of the method is that the first predefined signal at the predefined output of the first controller is generated in that the output is decoupled.

The invention has, amongst others, the following advantages. It is not necessary for the independent controller to generate electrical signals on the line to be measured. It only compares logical responses which are output by the controllers A and B and evaluates this information. The controllers A and B generate directly and measure directly signals on the line to be measured.

Further features and advantages of the invention result from the following description of exemplified embodiments whereby reference is made to the attached drawings, in which.

Figure 1:
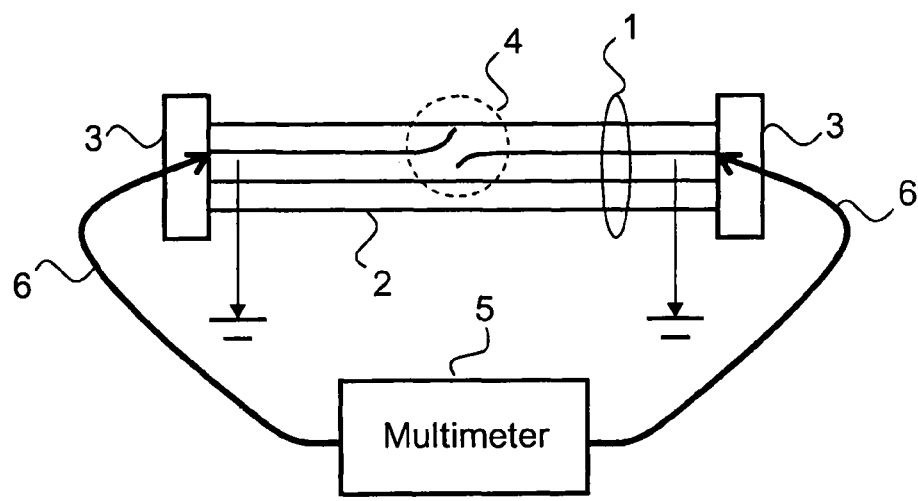
FIG. 1 shows, schematically, an example for testing a line according to the prior art.
Figure 2:
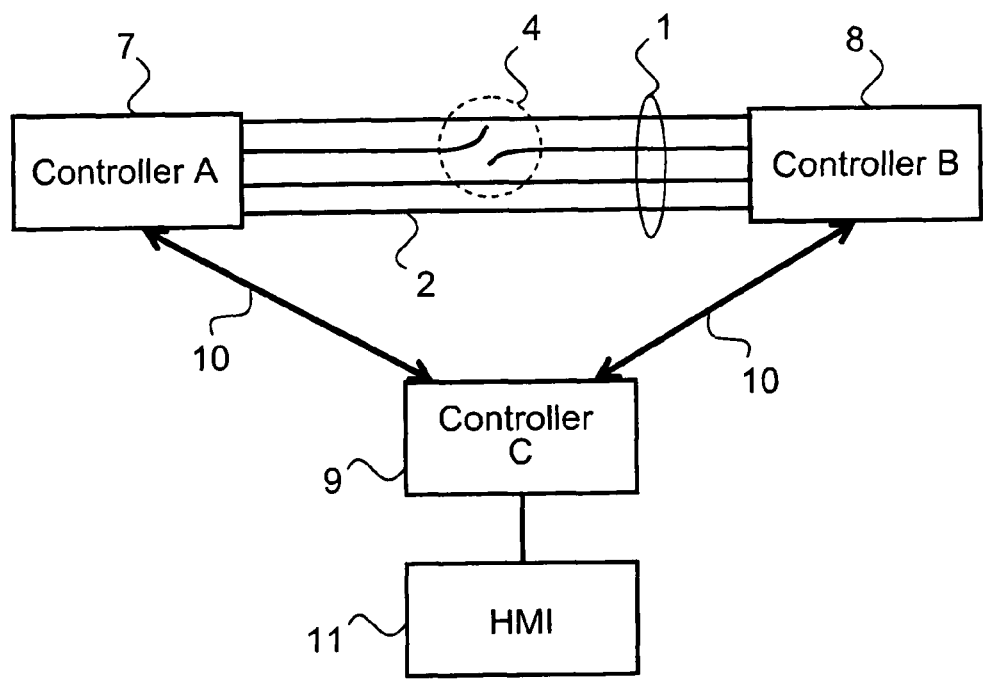
FIG. 2 shows, schematically, the connection of the participating controllers in a first embodiment of the method according to the invention.

A precondition for the method according to the invention is that a plurality of controllers can communicate with each other in a complex, intelligent system and a dialogue is possible by all of them with an independent controller. The controllers must be able to simulate signals at their outputs. This requirement is fulfilled in today's aircraft, in which intelligent controllers are provided that are connected to a plurality of central controllers. Examples are the flight warning computer, the central maintenance system, the display management computer and others. It is possible to conduct dialogues according to a defined protocol between the central maintenance system and other system controllers. A precondition for this is that the controllers can simulate signals at their outputs.

In case of interference in the communication between two systems (controllers) a third, central controller is used. This is used to initialise a special interactive operating state in the controller A and the controller B. In this operating state the central controller can predefine for example some actions that are to be carried out by the controller A or by the controller B. It can ask the system A to output some parameters on the output bus. It can ask the system B to monitor the receipt of the parameters which are sent by the system A on the bus and to forward these received parameters to the central controller. It can ensure that the parameters received by the system are indicated on a display of a human-machine interface whereby the human-machine interface can be a portable computer, a touch screen or similar.

The testing procedure can be carried out in the cockpit by the maintenance team. The following steps must thereby be carried out:

The central controller accesses the human-machine interface. Through the central controller the interactive operating state is initialised in the controller A. The Controller A is asked to send some parameters on the output bus to the controller B. The values of the parameters that are output by the system A are indicated on the human-machine interface Through the central controller the interactive operating state in the controller B is initialised. The controller B is asked to accept the data received by the controller A and to send the values of the received parameters to the central controller so that they can be indicated on the human-machine interface. The data sent by the system A are compared with the data received by the system B. A connection fault is thus diagnosed if no data are received by the system B.

The technical implementation contains the following elements:

A central controller must be present which is connected to a plurality of the controllers in the aircraft and a human-machine interface. Each controller that is connected to the central controller must have an interactive operating state, in which it is possible to carry out a duplex communication (dialogue) with the central controller and to execute commands or to send them to or receive them from the central controller.

Each controller must be able to assume two interactive operating states:

It must be able to generate its own output bus parameters or different operating states on each discrete output whereby it uses the values that are predefined by the maintenance team in the central controller. It must be able to monitor its own respective input bus and discrete input and to send the received values to the central controller in order to be able to display them there on the human-machine interface.

The connection testing can be implemented in the central controller in different ways:

In dependence upon the possibilities of each system in relation to the control and monitoring of all outputs and inputs, as described above, the central controller must offer the possibility that each system can generate parameters on each output (whereby the values are fixed a priori at a predefined value or defined by the maintenance team) and can indicate the parameters received at each input. The testing whether the received data are identical to the sent data is realised through visual checking by the maintenance team. The central controller can have a function which could be described as a "testable connection between system A and system B" and which is initialised by the maintenance team. The whole testing procedure can be dealt with automatically by the central controller and contains the steps: instructing the system A to generate a predefined output parameter (the parameter values are set to a predefined value), receiving of the input parameters of the system B, checking whether the parameters sent by the system A are identical to the parameters received by the system B, indication of the result of the last check. The central controller can have a function which could be described as "checks of all interfaces of the system A" and which is initialised by the maintenance team. The whole testing procedure can be dealt with automatically by the central controller and contains the information: topology data with the definition of all interfaces for each system (e.g. all systems which communicate with the system A, and the type of each communication connection is known to and stored in the central controller), execution of the connection test described above for each communication connection (all possible combinations of system A and system B, insofar as stored in the topology data).

Details of the invention are given below by reference to the drawings.

FIG. 1 shows, schematically, a simple method for circuit continuity testing of a bus line in order to clarify the differences between the prior art and the invention. It is thereby assumed that in a communication bus 1 with a plurality of bus lines 2 one is interrupted. The communication bus 1 connects two communication ports 3 with each other. A line 2 of the communication bus 1 is interrupted at a point 4. In order to find out whether a line 2 and possibly which line 2 is interrupted, a multimeter is connected to both ports 3 and indeed in series to each connection of a line 2 of the bus 1. This is realised through supply lines 6 of the multimeter 5. With each line the respective potential is then measured on both sides in relation to earth. This is shown by an arrow between the line and the earth symbol. If the same potential (unequal to zero) is detected by the multimeter on both sides, the line is deemed interference-free; otherwise, interference is indicated. It is clear to the person skilled in the art that the supply lines 6 can be very long under unfavourable geometric conditions and therefore the implementation of a line test can require great resources.

In the method according to the invention on the other hand it is assumed that components of a communication network are already installed in an aircraft. Interference may thereby exist between any two controllers of the communication network, for example between a controller A, 7 and a controller B, 8. Another controller C, 9 is then used in the communication network as an independent controller which is connected to the two controllers A and B via a controller communication bus 10. The controller communication bus 10 may be identical to the communication connection bus 1, but it can just as well be part of another network in the aircraft.

The independent controller C, 9 is also connected to a human-machine interface 11 which is also described below as an HMI. By means of this HMI 11 the measurement result is visualised.

The independent controller C, 9 controls and monitors in this measurement the two subordinate controllers 7 and 8 and evaluates the signals from and to the two controllers A and B. This is clarified below by reference to FIG. 4.

Figure 3:
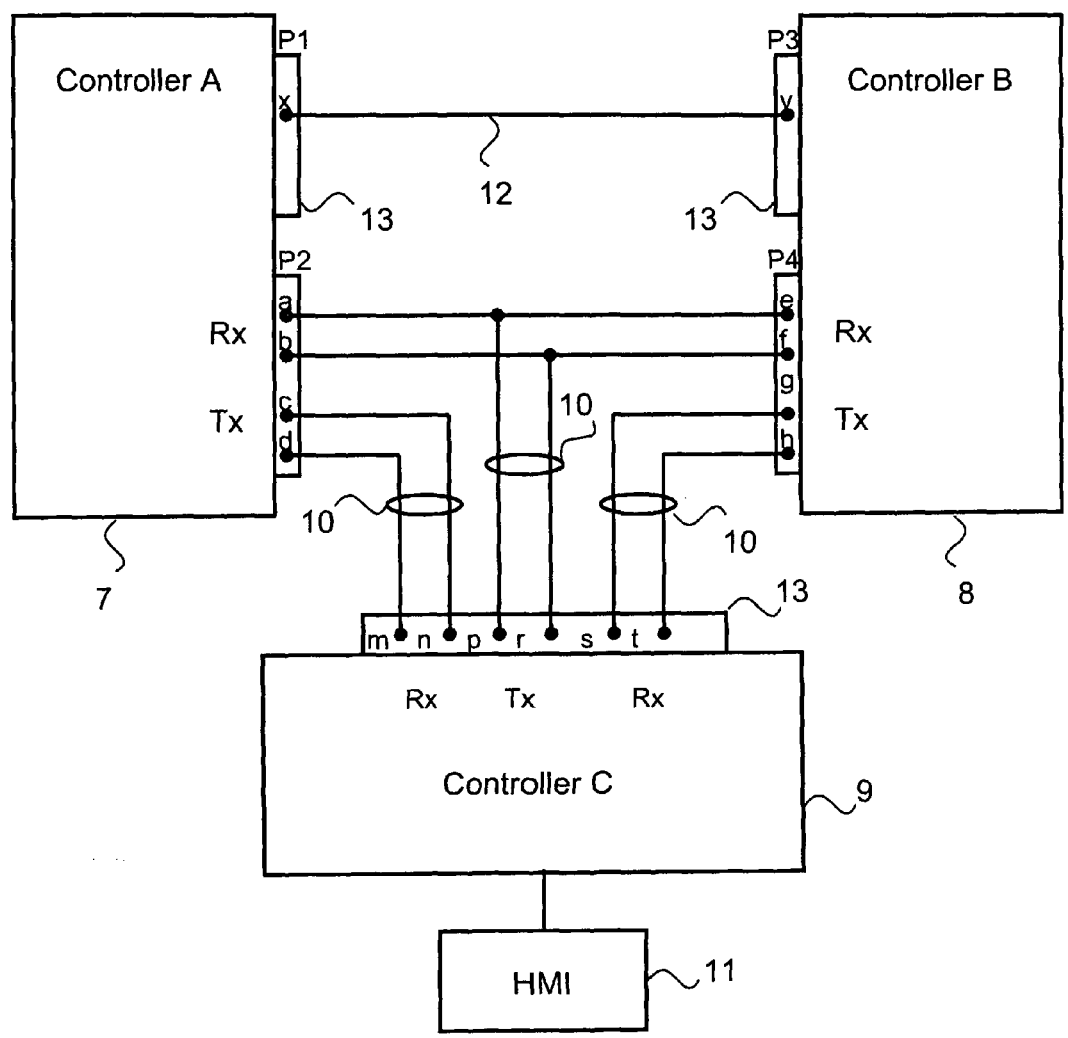
FIG. 3 shows, schematically, the connection of the participating controllers in a second embodiment of the method according to the invention.

A somewhat different situation is shown in FIG. 3, wherein the current through an individual line L, 12 is to be tested. This line 12 connects the controller 7 via the output connection "x" of its port "P1" to the controller 8 via the incoming connection "y" of is port "P3". In addition both controllers 7 and 8 are connected via their ports "P2" or "P4" with the connections "a", "b", "c", "d" or "e", "f", "g", "h" to the controller 9 via its port 13 with the connections "m", "n", "p", "r", "s", "t". In the embodiment shown, the connections "c", "d" are thereby put together after "m", "n" to form a first bus 10; the connections "a", "b" and "e", "f" after "p", "r", are put together to form a second bus 10; the connections "g", "h" after "s", "t" are put together to form a third bus 10. The second bus 10 thereby serves for the transmission of commands from the independent controller 9 to the two controllers 7 and 8 and the first and the second bus 10 serve for feedback of measurement results from the two controllers 7 and 8 to the independent, superordinate controller. The measurement and comparison result is then shown on the HMI 11.

Specifically, the controller 7 can simulate the status at the output "x". The status of the output "x" can thus in particular be decoupled ("open circuit") or supplied connected to earth ("ground").

With the aid of the communication buses 10 "c", "d" after "m", "n" and "a", "b" after "p", "r", the controller 7 and the controller 9 can communicate using a communication protocol. The controller 9 sends its commands and messages via the communication bus 10 "a", "b", after. "p", "r" to the controller 7. The controller 7 sends its results and messages via the communication bus 10 "c", "d" after "m", "n" to the controller 9. There is thus, with the aid of the communication protocol, a dialogue between the controller 7 and the controller 9 established.

Using the communication bus 10 "e", "f" after "p", "r" and "g", "h" after "s", "t", the controller 8 and the controller 9 can communicate using a communication protocol. The controller 9 sends its commands and messages via the communication bus 10 "e", "f" after "p", "r" to the controller 8. The controller 8 sends its results and messages via the communication bus 10 "g", "h" after "s", "t" to the controller 9. There is thus a dialogue between the controller 8 and the controller 9 using a communication protocol.

The current throughput of the line 12 is tested by the following steps:

The controller 9 commands the controller 7 to set the output "x" to the status "ground". —The controller 7 sets the output "x" to the status "ground" and responds to the controller 9 that the command has been executed. —The controller 9 commands the controller 8 to ascertain the status of the input "y". —The controller 8 ascertains the status of the input "y" and sends the result to the controller 9. —The controller 9 compares the response of the controller 8 with the reference status "ground": in case of the response "ground" of the controller 8 the line 12 is interference-free; in case of the response "open circuit" of the controller 8 the line 12 is distorted. —The controller 9 commands the controller 7 to set the output "x" to the status "open circuit". —The controller 7 sets the output "x" to the status "open circuit" and responds to the controller 9 that the command has been executed. —The controller 9 commands the controller 8 to ascertain the status of the input "y". —The controller 8 ascertains the status of the input "y" and sends the result to the controller 9. —The controller 9 compares the response of the controller 8 with the reference status "open circuit"; in case of the response "open circuit" of the controller 8 the line 12 is interference-free; in case of the response "ground" of the controller 8 the line 12 is distorted.

If one of the two results in the above steps is "distorted" the status of the line 12 is not in order: the line is either interrupted or has a short circuit to earth.

Other technical solutions exist for the case that the line 12 is replaced by a communication bus between the controllers 7 and 8. The bus can be used with the aid of a protocol such as ARINC429 to ascertain parameters from the controller 7 to the controller 8. In this case the state of the communication bus can be ascertained.

Figure 4:
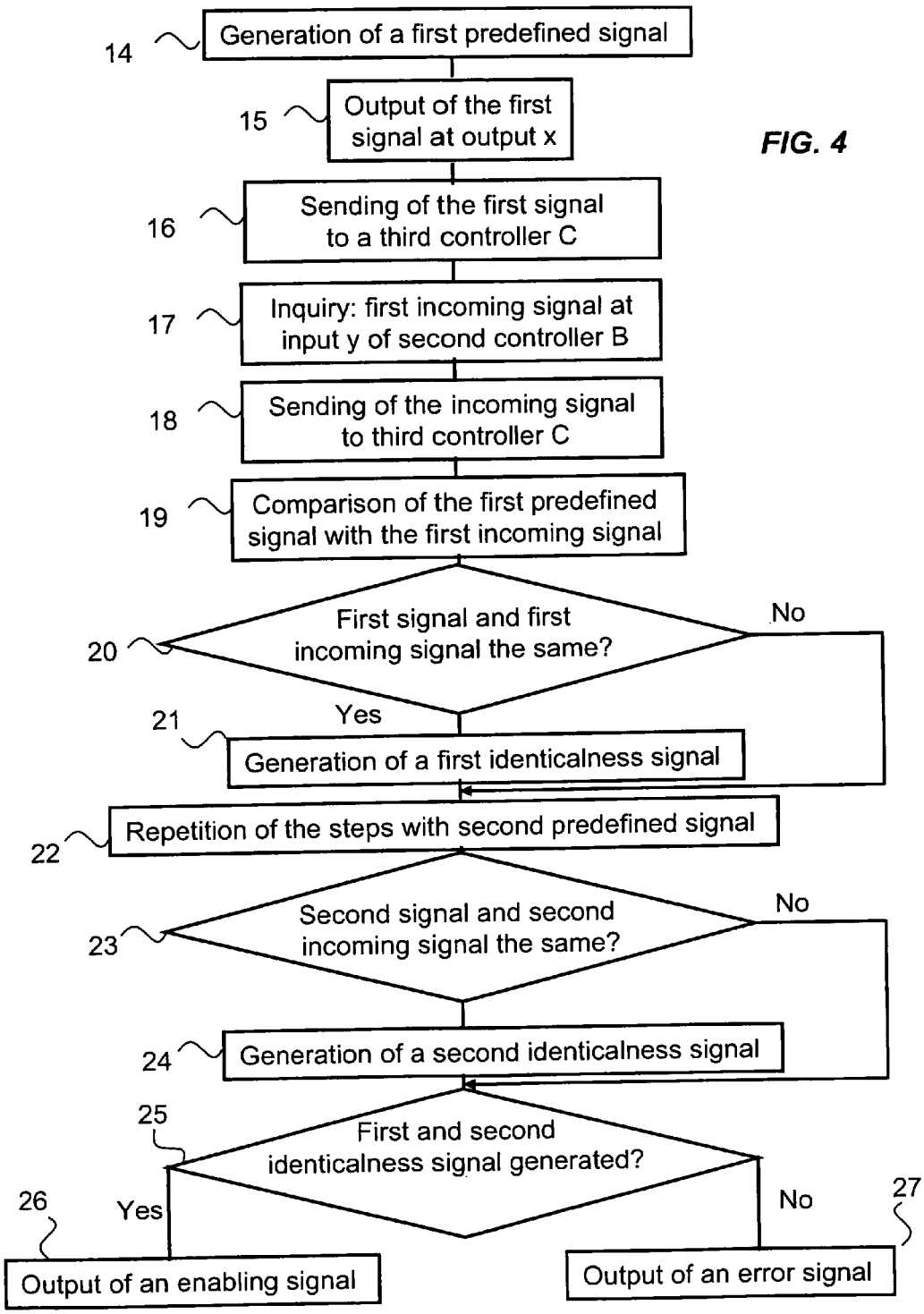
FIG. 4 shows an embodiment of the method according to the invention as a flowchart.

The method sequence is explained below by reference to the flowchart of FIG. 4.

In a first step 14 a first predefined signal is generated by the controller 7 which is supplied in step 15 to its output "x". At the same time in step 16 this first signal is sent to the controller 9 so that the latter has it available for later comparison purposes. The controller 9 asks the second controller 8 to detect a first incoming signal at the input "y" of the second controller 8. This occurs in step 17. The controller 8 sends the detection result to the controller 9 in step 18. The controller 9 is thus able to compare the detection result of step 17 with the prescribed value of step 15. This comparison is carried out in step 19. If in step 20 it is ascertained through the controller that the first signal of step 15 and the incoming signal of step 17 are the same the method is continued in such a way that in step 21 a corresponding identicalness signal is generated; otherwise, i.e. if it is ascertained by the controller 9 that the first signal of step 15 and the incoming signal of step 17 are not the same, step 21 is bypassed.

After step 21 there is a return in both cases to step 22, in which the steps 14 to 19 are identically repeated, but whereby a second predefined signal is generated instead of the first signal. In step 23 it is checked, as in step 20, whether the second signal from the repetition of step 15 and the incoming signal from the repetition of step 17 are the same. If this is the case, a further identicalness signal is generated in step 24. This step 24 is then bypassed if the second signal and the current incoming signal are not the same.

In step 25 it is checked by the controller whether both the first and the second identicalness signals are present. Only if this is the case an enabling signal is output in step 26, i.e. it is documented that the corresponding line is interference-free; otherwise, an error signal is output in step 27, which indicates interference on the line investigated. Both signals from step 26 and 27 are visualised via the HMI 11.

REFERENCE NUMERALS

1 Communication connection bus
2 Communication connection line
3 Communication connection port
4 Interruption of communication connection line
5 Multimeter
6 Multimeter supply line
7 First controller (A)
8 Second controller (B)
9 Third controller (C)
10 Controller communication bus
11 Human-machine interface HMI
12 Individual line
13 Controller port
14 Generation of a first predefined signal
15 Output of the first signal at output "x"
16 Sending of the first signal to a third controller C
17 Detection of a first incoming signal at input "y" of the second controller B
18 Sending of the incoming signal to third controller C
19 Comparison of the first predefined signal with the first incoming signal
20 Inquiry: first signal and first incoming signal the same?
21 Generation of a first identicalness signal
22 Repetition of the steps with second predefined signal
23 Inquiry: second signal and second incoming signal the same?
24 Generation of a second identicalness signal
25 Inquiry: first and second identicalness signal generated?
26 Output of an enabling signal
27 Output of an error signal

The invention claimed is:

1. Method for testing a communication connection (1) in a communication network in an aircraft with at least a first controller (7), a second controller (8) and a third (9) controller, comprising the steps:
   generation (14) of a first predefined signal, output (15) of the first signal at a predefined output (x) of the first controller (7) and sending (16) of the first signal to the third controller (9) by the first controller (7);
   detection (17) of a first incoming signal at a predefined input (y) of the second controller (8) which is connected via the communication connection (1) to the predefined output (x) of the first controller (7), and sending (18) of the incoming signal to the third controller (9) by the second controller (8);
   comparison (19) of the first predefined signal with the first incoming signal by the third controller (9) and generation (21) of a first identicalness signal if the first predefined signal and the first incoming signal are the same;
   repetition (22) of the steps with a second predefined signal and generation of a second identicalness signal by the third controller (9) if the second predefined signal and a second incoming signal are the same;
   output (26) of an enabling signal if the first and the second identicalness signal have been generated.

2. Method for testing a communication connection according to claim 1, wherein the first predefined signal at the predefined output (x) is a modulated electrical signal.

3. Method for testing a communication connection according to claim 2, wherein it is checked whether essentially the same modulated electrical signal can be found at the predefined input (y) of the second controller (8).

4. Method for testing a communication connection according to claim 1, wherein the first predefined signal is generated at the predefined output (x) of the first controller (7) in that the output (x) is supplied with connection to earth.

5. Method for testing a communication connection according to claim 1, wherein the first predefined signal is generated at the predefined output (x) of the first controller (7) in that the output (x) is decoupled.

\* \* \* \* \*